United States Patent
Menkus et al.

(10) Patent No.: US 11,632,122 B2
(45) Date of Patent: Apr. 18, 2023

(54) STABLE LOW-POWER ANALOG-TO-DIGITAL CONVERTER (ADC) REFERENCE VOLTAGE

(71) Applicant: AyDeeKay LLC, Aliso Viejo, CA (US)

(72) Inventors: Christopher A. Menkus, Aliso Viejo, CA (US); Robert W. Kim, Aliso Viejo, CA (US)

(73) Assignee: AyDeeKay LLC, Aliso Viejo, CA (US)

( * ) Notice: Subject to any disclaimer, the term of this patent is extended or adjusted under 35 U.S.C. 154(b) by 0 days.

(21) Appl. No.: 17/342,526

(22) Filed: Jun. 8, 2021

(65) Prior Publication Data

US 2022/0216880 A1    Jul. 7, 2022

Related U.S. Application Data

(60) Provisional application No. 63/134,954, filed on Jan. 7, 2021.

(51) Int. Cl.
*H03M 1/38* (2006.01)
*H03M 1/12* (2006.01)

(52) U.S. Cl.
CPC ............ *H03M 1/38* (2013.01); *H03M 1/129* (2013.01)

(58) Field of Classification Search
CPC .................................. H03M 1/38; H03M 1/129
USPC ........................................ 341/161, 163, 172
See application file for complete search history.

(56) References Cited

U.S. PATENT DOCUMENTS

| | | | |
|---|---|---|---|
| 7,289,052 B1 * | 10/2007 | Atris | H03M 1/1225 341/122 |
| 8,319,673 B2 * | 11/2012 | Steensgaard-Madsen | H03M 1/18 341/131 |
| 9,154,152 B1 | 10/2015 | Chiu et al. | |
| 9,467,638 B2 | 10/2016 | Chen et al. | |
| 9,705,520 B1 | 7/2017 | Kumar et al. | |

(Continued)

FOREIGN PATENT DOCUMENTS

| CN | 102801422 A | 11/2012 |
|---|---|---|
| CN | 111446964 A | 7/2020 |

OTHER PUBLICATIONS

PCT Patent Appl. Serial No. PCT/US21/64299, International Search Report and Written Opinion, Feb. 28, 2022.

*Primary Examiner* — Khai M Nguyen
(74) *Attorney, Agent, or Firm* — Steven Stupp (57) ABSTRACT

A conversion circuit that performs analog-to-digital conversion is described. During operation, the conversion circuit receives an input signal. Then, the conversion circuit performs analog-to-digital conversion and provides a quantized output corresponding to the input signal based at least in part on a first power-supply voltage and a second power-supply voltage of the conversion circuit. For example, the quantized output may be based at least in part on a comparison of the input signal to the first power-supply voltage and the second power-supply voltage. Moreover, the first power-supply voltage and the second power-supply voltage may specify a full-scale range of the conversion circuit. When the full-scale range exceeds a second full-scale range associated with reference voltages that are other than the first power-supply voltage and the second power-supply voltage, the quantized output may correspond to a larger number of bits (Continued)

than when the full-scale range equals the second full-scale range.

20 Claims, 5 Drawing Sheets

(56) References Cited

U.S. PATENT DOCUMENTS

| | | |
|---|---|---|
| 10,135,453 B2 | 11/2018 | Hernes |
| 10,541,706 B2 | 1/2020 | Erol et al. |
| 2003/0006926 A1 | 1/2003 | Nikai et al. |
| 2004/0032358 A1 | 2/2004 | Asami |
| 2010/0103015 A1 | 4/2010 | Yoshida et al. |
| 2019/0109648 A1 | 4/2019 | Noguchi |
| 2020/0280692 A1 | 9/2020 | Akahane |

* cited by examiner

STABLE LOW-POWER ANALOG-TO-DIGITAL CONVERTER (ADC) REFERENCE VOLTAGE

CROSS REFERENCE TO RELATED APPLICATIONS

This application claims priority under 35 U.S.C. 119(e) to U.S. Provisional Application Ser. No. 63/134,954, entitled "Stable Low-Power Analog-to-Digital Converter Reference Voltage," by Christopher A. Menkus, et al., filed on Jan. 7, 2021, the contents of both of which are herein incorporated by reference.

FIELD

The present disclosure relates to a conversion circuit, such as an analog-to-digital converter (ADC). Notably, the present disclosure relates to a conversion circuit that uses power-supply voltages as reference voltages, and which maintains the resolution of the conversion circuit by increasing the number of bits of quantization and/or scaling the quantized output of the conversion circuit using a ratio of a full-scale range corresponding to the power-supply voltages to a second full-scale range associated with reference voltages that are other than or different from the power-supply voltages.

BACKGROUND

An ADC is a widely used circuit component for converting an analog signal into a quantized or digital representation. Typically, an ADC performs this conversion based at least on reference voltages.

Figure 1:
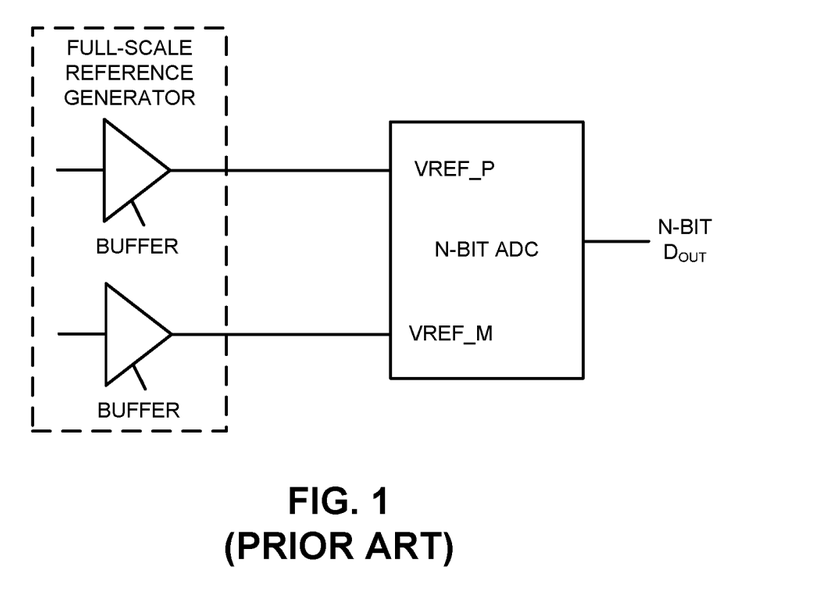
FIG. 1 is a block diagram illustrating an example of an existing conversion circuit.

For example, as shown in FIG. 1, which presents an existing conversion circuit, a full-scale reference generating circuit may provide reference voltages, VREF_P and VREF_M, to an N-bit ADC. The reference voltages may define a full-scale range of the N-bit ADC. Moreover, the N-bit ADC may provide a quantized output, N-bit Dout, corresponding to an analog input signal based at least in part on the reference voltages. Notably, the N-bit ADC may compare the input signal to the reference voltages when determining the quantized output.

Because of switching noise in the N-bit ADC, the reference voltages provided by the full-scale reference generating circuit are typically buffered. In some conversion circuits, a large bypass capacitor is used to help stabilize the buffered reference voltages and to reduce noise.

However, it is often difficult to use multiple large capacitors in a conversion circuit, such as in a multi-unit interleaved array of ADCs. Notably, the large capacitors typically occupy a large area on a semiconductor die or an integrated circuit. Moreover, if extra redundant bits are added in the conversion process, e.g., to account for errors introduced by incomplete settling of the reference voltages or because of noise, there may also be an adverse impact on the conversion speed of the conversion circuit.

Furthermore, reference-voltage generating and buffering circuits typically consume a lot of power in switched-capacitor data-conversion circuits (such as successive-approximation-register or SAR ADCs), and are a potential source of noise and settling errors. In general, the settling time and noise of a conversion circuit are inversely proportional to the bias current or power. Notably, a larger bias current is associated with a lower impedance, less noise and faster settling time.

Additionally, smaller reference voltages are usually desirable for detecting small-amplitude input signals, but smaller reference voltages often increase resistance of the feedback switches that are typically used in a capacitive-feedback ADC. This is because the smaller reference voltages typically require switch voltages near the middle of the supply range, which reduce the amount of switch overdrive voltage.

SUMMARY

Embodiments of an integrated circuit are described. This integrated circuit includes a conversion circuit. During operation, the conversion circuit performs analog-to-digital conversion and provides a quantized output corresponding to an input signal based at least in part on a first power-supply voltage and a second power-supply voltage of the integrated circuit.

Note that the quantized output may be based at least in part on a comparison of the input signal to the first power-supply voltage and the second power-supply voltage.

Moreover, the first power-supply voltage and the second power-supply voltage may specify a full-scale range of the conversion circuit. When the full-scale range exceeds a second full-scale range associated with reference voltages that are other than the first power-supply voltage and the second power-supply voltage, the quantized output may correspond to a larger number of bits than when the full-scale range equals the second full-scale range. Alternatively or additionally, there may be extra bits for redundancy, which are used to correct errors in the analog-to-digital conversion (e.g., because of settling errors). Furthermore, when the full-scale range exceeds the second full-scale range, the conversion circuit may scale the quantized output based at least in part on a ratio of the full-scale range to the second full-scale range. In some embodiments, the conversion circuit includes an interleaved set of unit ADCs. Note that the conversion circuit may correct for differences in quantized outputs of the set of unit ADCS, and the correction may include adjusting the ratio of at least one of the unit ADCs.

Furthermore, the first power-supply voltage may include a positive power-supply voltage and the second power-supply voltage may include a negative power-supply voltage or ground.

Additionally, the conversion circuit may include: a SAR ADC, or a pipeline ADC.

Another embodiment provides an electronic device that includes the conversion circuit.

Another embodiment provides a system that includes the conversion circuit.

Another embodiment provides a method for performing analog-to-digital conversion. This method includes at least some of the operations performed by the conversion circuit.

This Summary is provided for purposes of illustrating some exemplary embodiments, so as to provide a basic understanding of some aspects of the subject matter described herein. Accordingly, it will be appreciated that the above-described features are examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF DRAWINGS

Note that like reference numerals refer to corresponding parts throughout the drawings. Moreover, multiple instances of the same part are designated by a common prefix separated from an instance number by a dash.

DETAILED DESCRIPTION

An integrated circuit is described. This integrated circuit includes a conversion circuit that performs analog-to-digital conversion of an input signal. For example, the conversion circuit may include a SAR ADC. Notably, the conversion circuit provides a quantized output corresponding to the input signal based at least in part on a first power-supply voltage and a second power-supply voltage of the integrated circuit, where the first power-supply voltage and the second power-supply voltage specify a full-scale range of the conversion circuit. Moreover, the first power-supply voltage includes a positive power-supply voltage and the second power-supply voltage includes a negative power-supply voltage or ground. Furthermore, when the full-scale range exceeds a second full-scale range associated with reference voltages that are other than the first power-supply voltage and the second power-supply voltage, the quantized output may correspond to a larger number of bits than when the full-scale range equals the second full-scale range. Alternatively or additionally, when the full-scale range exceeds the second full-scale range, the conversion circuit scales the quantized output based at least in part on a ratio of the full-scale range to the second full-scale range.

By performing the analog-to-digital conversion based at least in part on the power-supply voltages, these circuit techniques may reduce or eliminate the need for buffer circuits, bias current and/or large bypass capacitors. Moreover, the conversion techniques may reduce noise, may decrease the area on a semiconductor die, may reduce the power consumption and/or may increase the speed or decrease the settling time of the conversion circuit. Consequently, the circuit techniques may improve the performance of an ADC. One or more of these capabilities may allow the embodiments of the conversion circuit and/or the ADC to be used in a wide variety of systems, electronic devices and applications.

In the present disclosure, note that 'full-scale' is sometimes referred to as 'gain.' Full scale may provide or specify the quantized output level based on an analog input level.

Figure 2:
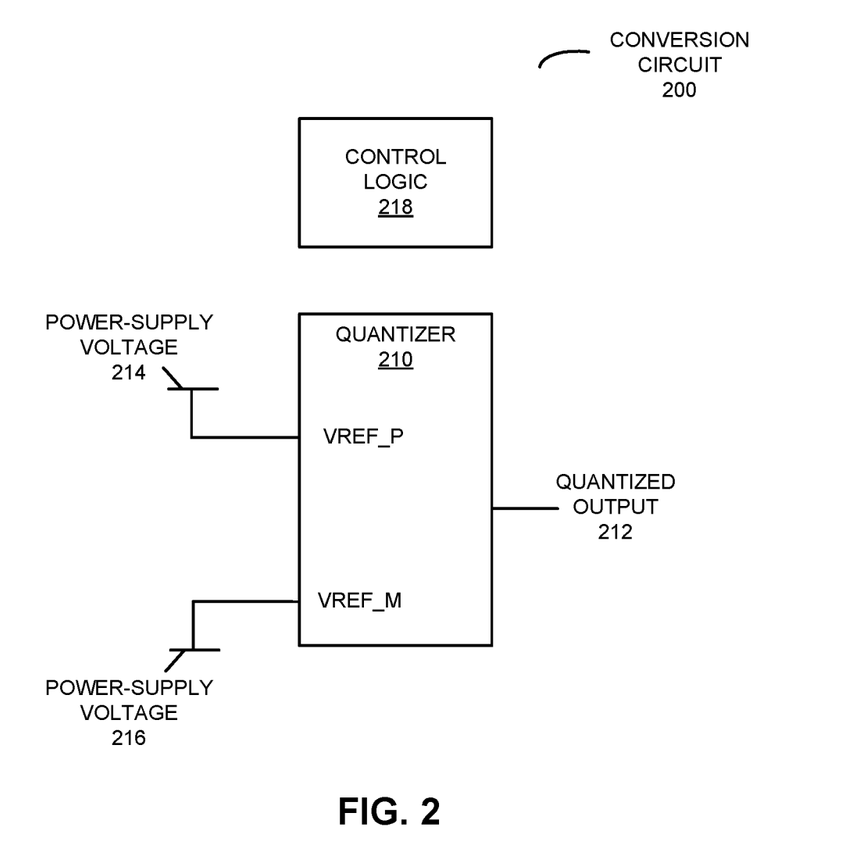
FIG. 2 is a block diagram illustrating an example of a conversion circuit according to some embodiments of the present disclosure.

We now describe embodiments of the circuit techniques and the conversion circuit. As shown in FIG. 2, which presents an example of a conversion circuit 200 in embodiments of the present disclosure, a quantizer 210 may provide at least an N-bit quantized output 212 corresponding to an input signal based at least in part on a first power-supply 214 voltage and a second power-supply voltage 216, e.g., of an integrated circuit that includes conversion circuit 200. The first power-supply voltage 214 and the second power-supply voltage 216 may define a full-scale or dynamic range of conversion circuit 200. Moreover, the first power-supply voltage 214 may include a unipolar power-supply voltage (such as, e.g., a positive power-supply voltage VDD) and the second power-supply voltage 216 may include ground (VSS). Note that the first power-supply voltage 214 and the second power-supply voltage 216 may be very stable. While FIG. 2 illustrates single-ended embodiments of the conversion techniques, in other embodiments conversion circuit 200 may be differential. In these embodiments, the second power-supply voltage 216 may also be unipolar and may have an opposite polarity to the first power-supply voltage 214 (such as, e.g., a negative power-supply voltage).

Furthermore, when the full-scale range exceeds a second full-scale range of conversion circuit 200 associated with reference voltages other than the first power-supply voltage 214 and the second power-supply voltage 216, quantized output 212 may correspond to a larger number of bits than when the full-scale range equals the second full-scale range. For example, if the first full scale range is 1V, and the second full scale range is 0.5V, then one additional bit may be needed to resolve the larger associated dynamic range.

Consequently, as shown in FIG. 2, quantizer 210 may provide m-additional bits in quantized output 212, such that quantized output 212 corresponds to a total of N+ m bits. For example, in a 12-bits ADC, m may be 1, so that the total number of bits is 13. By using the additional m-bits, conversion circuit 200 may maintain the resolution of conversion circuit 200 even when the full-scale range of conversion circuit 200 is increased by, in part, using the first power-supply voltage 214 and the second power-supply voltage 216.

Figure 3:
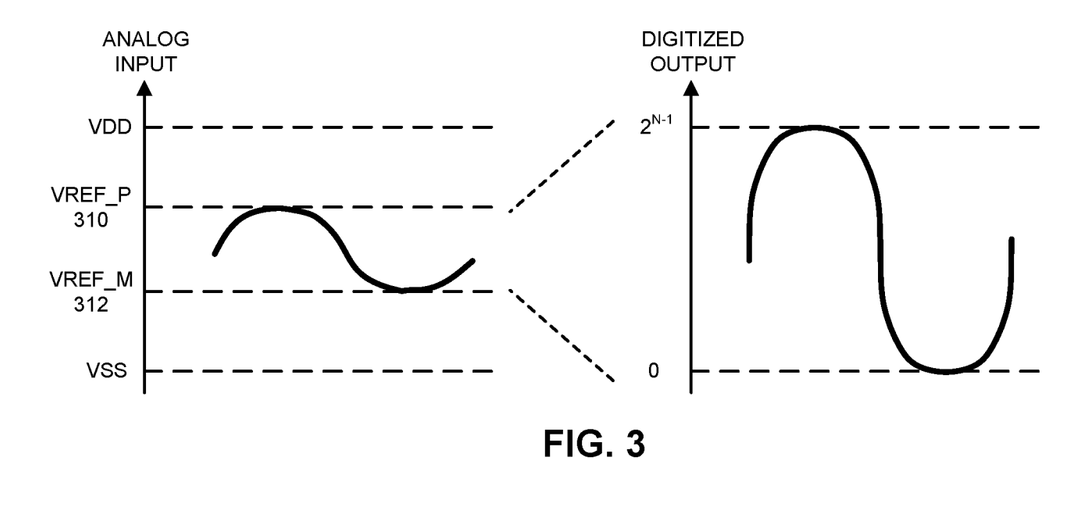
FIG. 3 is a drawing illustrating an example of scaling of a quantized output from a conversion circuit in embodiments of the present disclosure.

Alternatively or additionally, when the full-scale range exceeds the second full-scale range, conversion circuit 200 may scale quantized output 212 based at least in part on a ratio of the full-scale range to the second full-scale range. This is illustrated in FIG. 3, which presents an example of scaling of the quantized (or digitized) output of conversion circuit 200 in embodiments of the present disclosure. Notably, as discussed previously, reference voltages VREF_P 310 and VREF_M 312 may define the second full-scale range of an N-bit ADC. In embodiments of conversion circuit 200, in which the first power-supply voltage 214 and the second power-supply voltage 216 are used as reference voltages for conversion circuit 200, quantized output 212 may be scaled (e.g., multiplied) by the ratio of the full-scale range (or the power-supply range) to the second full-scale range. This may increase quantized output 212 so that quantized output 212 spans the full-scale range of conversion circuit 200.

Figure 4:
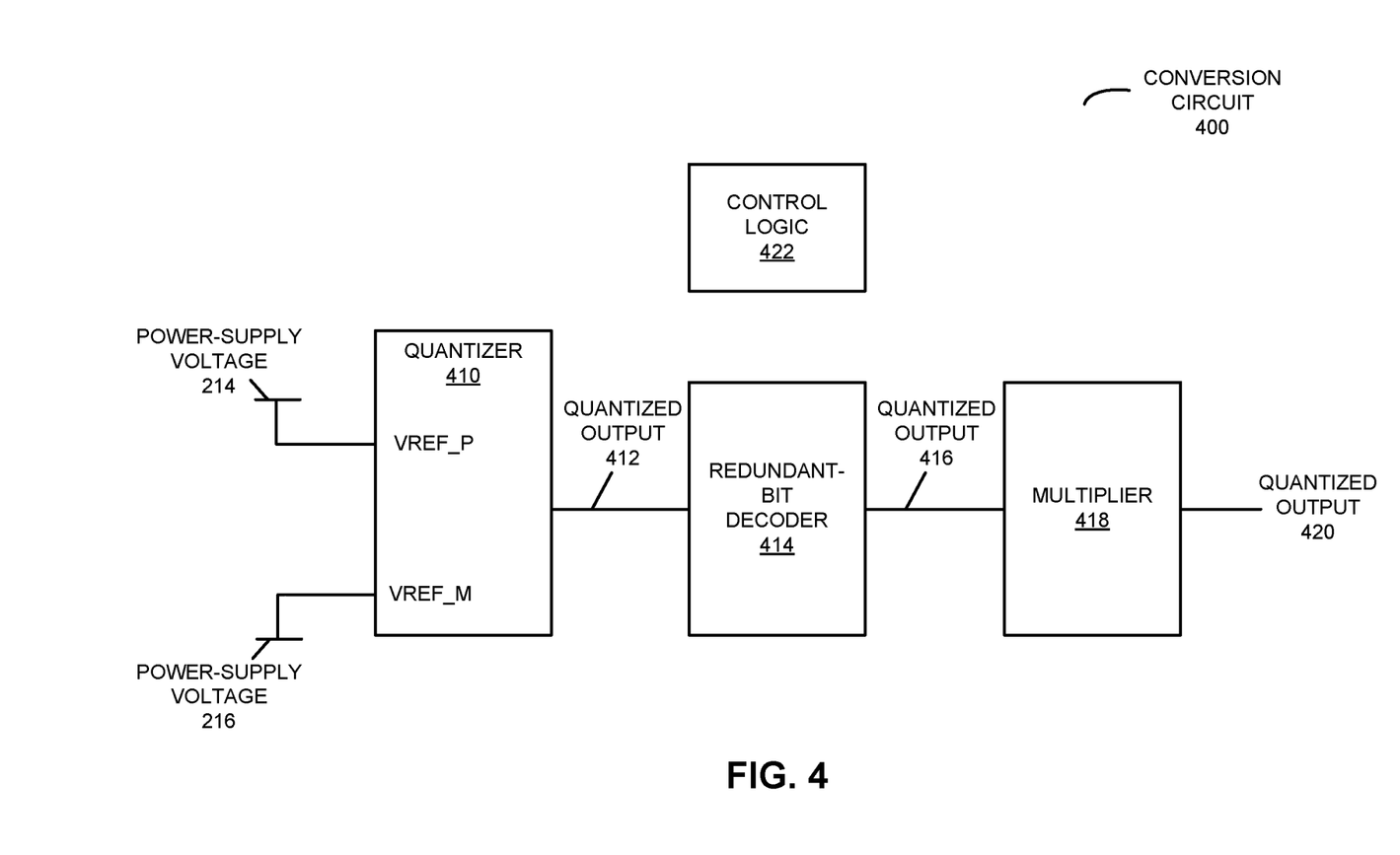
FIG. 4 is a block diagram illustrating an example of a conversion circuit according to some embodiments of the present disclosure.

In some embodiments, quantized output 212 of conversion circuit 200 may correspond to additional r redundant bits that can be used, e.g., for error correction. For example, a 13-bit ADC may include an additional two redundant bits. This is illustrated in FIG. 4, which presents an example of a conversion circuit 400 in embodiments of the present disclosure. In FIG. 4, a redundant-bit decoder 414 may use the additional r redundant bits after quantizer 410 to correct errors in quantized output 412, such as errors associated with noise. In addition, a multiplier 418 may multiply (or bit-shift and truncate) a quantized output 416 from decoder 414 by 2 m, so that a provided quantized output 420 from conversion circuit 400 corresponds to N-bits. This may convert a 13-bit quantized output back to a 12-bit quantized output.

For example, in some embodiments, 2 bits of redundancy (r) in the digital conversion may be used to help suppress the effects of power-supply noise. Thus, in some embodiments, quantizer 410 may perform N+ m+ r-bit quantization. After the conversion, the redundancy may be decoded to recover the original data word size. Notably, quantized output 416 from redundant-bit decoder 414 may include N+ m bits. Additionally, multiplier 418 may multiply quantized output 416 (i.e., a digital word) by 2 m (e.g., when m equals 1, it may bit-shift and truncate corresponding to a factor of 2) in order to recover the second full-scale range associated with the reference voltages that are other than the power-supply voltages 214 and 216. Thus, quantized output 420 may include N bits. When m equals 1 in this example, more generally, m used by conversion circuit 400 may be programmable or dynamic. Thus, conversion circuit 200 (FIG. 2) or 400 may be dynamically adapted by control logic 218 (FIG. 2) or 422.

In some embodiments, the conversion techniques may be used with an interleaved ADC. However, there may be variations in the full-scale ranges of different unit ADCs in the interleaved ADC. For example, the full-scale range of a given unit ADC may vary relative to other unit ADCs because of process variations, temperature and/or transistor mismatch. In these embodiments, the ratio used to scale the quantized output of the given unit ADC or conversion circuit may be adjusted (relative to the ratios used in at least some of the other unit ADCs) to correct for mismatches. Note that the adjustment may be determined by taking the average of the quantized outputs of the unit ADCs in the interleaved ADC with a large input signal. In principle, the quantized outputs in this case should be the same. Consequently, variations relative to the average of the quantized outputs can be used to compute the adjustment to the ratio used to scale the quantized output of the given unit ADC.

Referring back to FIG. 2, in some embodiments conversion circuit 200 may add a bit to a resolution of quantizer 210. This may allow a larger full-scale range (such as when the reference voltages of conversion circuit 200 are power-supply voltages 214 and 216) to be used without sacrificing the resolution. Note that a larger full-scale range may reduce the switch resistance, because the switches see a larger gate overdrive voltage. However, the use of the additional bit may increase the conversion time of conversion circuit 200.

If the allowed full-scale range is large enough, the first reference voltage 214 may be the positive power-supply voltage (VDD) and the second reference voltage 216 may be ground (VSS) instead of the usual reference voltages, VREF_P 310 (FIG. 3) and VREF_M 312 (FIG. 3). This may eliminate the standby bias current. Moreover, it may reduce or minimize a reference-voltage settling time of conversion circuit 200, because the power-supply and ground voltages typically have very low impedances. Consequently, this change may eliminate the need for an analog calibration feedback circuit in conversion circuit 200.

Furthermore, in an interleaved ADC, which may require gain matching across the array, the quantized outputs from each interleaved unit ADC may be passed to a digital block or control logic for post-processing correction. In this control logic, gain errors of the unit ADCs may be detected by averaging the quantized outputs or the quantized output power. Then, the gains may be corrected by adjusting the ratio or multiplier coefficients used by the unit ADCs. Note that a least-mean square or another coefficient adjustment technique can be used.

In some embodiments, extra power-supply bypass capacitors may be used to help reduce power-supply noise. Alternatively or additionally, a Kelvin tap of the power-supply connections may be used to provide some amount of resistive isolation between interleaved units ADCs that use the same power-supply references.

While the preceding discussion uses a SAR ADC as an example, the disclosed conversion technique may be used with another type of ADC, such as another type of interleaved ADC or a pipeline ADC.

In the present discussion, the analog-to-digital conversion performed by the conversion circuit may be applied to a wide variety of input signals. For example, an input signal may include a frame. This frame may include an image, where one or more ADCs in the conversion circuit may receive analog inputs corresponding to different spatial locations or regions. Alternatively, in some embodiments, such as in a scanning system, a frame may be progressively captured over a time interval (such as several milliseconds). Thus, in these embodiments, the one or more ADCs may receive analog inputs corresponding to different spatial locations or regions that are captured at different times.

Figure 5:
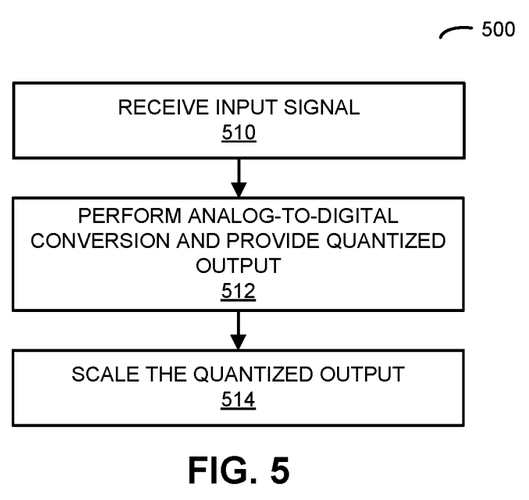
FIG. 5 is a flow diagram illustrating an example of a method for performing analog-to-digital conversion according to some embodiments of the present disclosure.

We now describe embodiments of a method. FIG. 5 presents a flow diagram illustrating an example of a method 500 for performing analog-to-digital conversion using a conversion circuit, such as conversion circuit 200 (FIG. 2) or 400 (FIG. 4). During operation, the conversion circuit may receive an input signal (operation 510). Then, the conversion circuit may perform analog-to-digital conversion and provide a quantized output (operation 512) corresponding to the input signal based at least in part on a first power-supply voltage and a second power-supply voltage of the conversion circuit.

In some embodiments of the method 500, there may be additional or fewer operations. For example, after the analog—to digital conversion (operation 512), the quantized output may be scaled (operation 514). Moreover, the order of the operations may be changed, and/or two or more operations may be combined into a single operation.

The disclosed conversion circuit and the circuit techniques can be (or can be included in) any electronic device. For example, the electronic device may include: a cellular telephone or a smartphone, a tablet computer, a laptop computer, a notebook computer, a personal or desktop computer, a netbook computer, a media player device, an electronic book device, a MiFi® device, a smartwatch, a wearable computing device, a portable computing device, a consumer-electronic device, an access point, a router, a switch, communication equipment, test equipment, a vehicle, a ship, an airplane, a car, a truck, a bus, a motorcycle, manufacturing equipment, farm equipment, construction equipment, or another type of electronic device.

Although specific components are used to describe the embodiments of the conversion circuit and/or the integrated circuit that includes the conversion circuit, in alternative embodiments different components and/or subsystems may be present in the conversion circuit, the integrated circuit that includes the conversion circuit, and/or the one or more ADCs. Thus, the embodiments of the conversion circuit, the integrated circuit that includes the conversion circuit, and/or the one or more ADCs may include fewer components, additional components, different components, two or more components may be combined into a single component, a single component may be separated into two or more components, one or more positions of one or more components may be changed, and/or there may be different types of components.

Moreover, the circuits and components in the embodiments of the conversion circuit, the integrated circuit that includes the conversion circuit, and/or the one or more ADCs may be implemented using any combination of analog and/or digital circuitry, including: bipolar, PMOS and/or NMOS gates or transistors. Furthermore, signals in these embodiments may include digital signals that have approximately discrete values and/or analog signals that have continuous values. Additionally, components and circuits may be single-ended or differential, and power supplies may be unipolar or bipolar. Note that electrical coupling or connections in the preceding embodiments may be direct or indirect. In the preceding embodiments, a single line corresponding to a route may indicate one or more single lines or routes.

As noted previously, an integrated circuit may implement some or all of the functionality of the circuit techniques. This integrated circuit may include hardware and/or software mechanisms that are used for implementing functionality associated with the circuit techniques.

In some embodiments, an output of a process for designing the integrated circuit, or a portion of the integrated circuit, which includes one or more of the circuits described herein may be a computer-readable medium such as, for example, a magnetic tape or an optical or magnetic disk. The computer-readable medium may be encoded with data structures or other information describing circuitry that may be physically instantiated as the integrated circuit or the portion of the integrated circuit. Although various formats may be used for such encoding, these data structures are commonly written in: Caltech Intermediate Format (CIF), Calma GDS II Stream Format (GDSII), Electronic Design Interchange Format (EDIF), OpenAccess (OA), or Open Artwork System Interchange Standard (OASIS). Those of skill in the art of integrated circuit design can develop such data structures from schematic diagrams of the type detailed above and the corresponding descriptions and encode the data structures on the computer-readable medium. Those of skill in the art of integrated circuit fabrication can use such encoded data to fabricate integrated circuits that include one or more of the circuits described herein.

While some of the operations in the preceding embodiments were implemented in hardware or software, in general the operations in the preceding embodiments can be implemented in a wide variety of configurations and architectures. Therefore, some or all of the operations in the preceding embodiments may be performed in hardware, in software or both. For example, at least some of the operations in the circuit techniques may be implemented using program instructions that are executed by a processor or in firmware in an integrated circuit.

Moreover, while examples of numerical values are provided in the preceding discussion, in other embodiments different numerical values are used. Consequently, the numerical values provided are not intended to be limiting.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
   a conversion circuit configured to perform analog-to-digital conversion and to provide a quantized output corresponding to an input signal based at least in part on a first power-supply voltage and a second power-supply voltage of the integrated circuit.

2. The integrated circuit of claim 1, wherein the quantized output is based at least in part on a comparison of the input signal to the first power-supply voltage and the second power-supply voltage.

3. The integrated circuit of claim 1, wherein the first power-supply voltage and the second power-supply voltage specify a full-scale range of the conversion circuit.

4. The integrated circuit of claim 3, wherein, when the full-scale range exceeds a second full-scale range associated with reference voltages that are other than the first power-supply voltage and the second power-supply voltage, the quantized output corresponds to a larger number of bits than when the full-scale range equals the second full-scale range.

5. The integrated circuit of claim 4, wherein the number of bits comprises redundant bits and the conversion circuit is configured to use the redundant bits to correct errors in the analog-to-digital conversion.

6. The integrated circuit of claim 3, wherein, when the full-scale range exceeds the second full-scale range, the conversion circuit is configured to scale the quantized output based at least in part on a ratio of the full-scale range to the second full-scale range.

7. The integrated circuit of claim 6, wherein the conversion circuit comprises an interleaved set of unit analog-to-digital converters (ADCs).

8. The integrated circuit of claim 7, wherein the conversion circuit is configured to correct for differences in quantized outputs of the set of unit ADCS; and
   wherein the correction comprises adjusting the ratio of at least one of the unit ADCs.

9. The integrated circuit of claim 1, wherein the first power-supply voltage comprises a positive power-supply voltage and the second power-supply voltage comprises a negative power-supply voltage or ground.

10. The integrated circuit of claim 1, wherein the conversion circuit comprises a successive-approximation-register (SAR) analog-to-digital converter (ADC).

11. The integrated circuit of claim 1, wherein the conversion circuit comprises a pipeline analog-to-digital converter (ADC).

12. A system, comprising:
    a conversion circuit configured to perform analog-to-digital conversion and to provide a quantized output corresponding to an input signal based at least in part on a first power-supply voltage and a second power-supply voltage of the conversion circuit.

13. The system of claim 12, wherein the quantized output is based at least in part on a comparison of the input signal to the first power-supply voltage and the second power-supply voltage.

14. The system of claim 12, wherein the first power-supply voltage and the second power-supply voltage specify a full-scale range of the conversion circuit.

15. The system of claim 14, wherein, when the full-scale range exceeds a second full-scale range associated with reference voltages that are other than the first power-supply voltage and the second power-supply voltage, the quantized output corresponds to a larger number of bits than when the full-scale range equals the second full-scale range.

16. The system of claim 15, wherein the number of bits comprises redundant bits and the conversion circuit is configured to use the redundant bits to correct errors in the analog-to-digital conversion.

17. The system of claim 14, wherein, when the full-scale range exceeds the second full-scale range, the conversion circuit is configured to scale the quantized output based at least in part on a ratio of the full-scale range to the second full-scale range.

18. The system of claim 17, wherein the conversion circuit comprises an interleaved set of unit analog-to-digital converters (ADCs);
   wherein the conversion circuit is configured to correct for differences in quantized outputs of the set of unit ADCS; and
   wherein the correction comprises adjusting the ratio of at least one of the unit ADCs.

19. The system of claim 12, wherein the conversion circuit comprises: a successive-approximation-register (SAR) analog-to-digital converter (ADC) or a pipeline analog-to-digital converter (ADC).

20. A method for performing analog-to-digital conversion, comprising:
   by a conversion circuit:
   receiving an input signal; and
   performing analog-to-digital conversion and providing a quantized output corresponding to the input signal based at least in part on a first power-supply voltage and a second power-supply voltage of the conversion circuit.

* * * * *